United States Patent
Erdogan

(10) Patent No.: US 9,438,253 B2
(45) Date of Patent: Sep. 6, 2016

(54) HIGH SPEED CURRENT MODE LATCH

(71) Applicant: TEXAS INSTRUMENTS INCORPORATED, Dallas, TX (US)

(72) Inventor: Mustafa Ulvi Erdogan, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/727,990

(22) Filed: Jun. 2, 2015

(65) Prior Publication Data

US 2015/0349786 A1    Dec. 3, 2015

Related U.S. Application Data

(60) Provisional application No. 62/006,981, filed on Jun. 3, 2014.

(51) Int. Cl.
| | |
|---|---|
| *H03L 7/08* | (2006.01) |
| *H03L 7/087* | (2006.01) |
| *H04L 7/00* | (2006.01) |
| *H03L 7/089* | (2006.01) |

(52) U.S. Cl.
CPC .......... *H03L 7/0807* (2013.01); *H03L 7/087* (2013.01); *H03L 7/089* (2013.01); *H04L 7/0045* (2013.01)

(58) Field of Classification Search
CPC ..... H03L 7/0807; H03L 7/087; H03L 7/089; H04L 7/0045
USPC .......................... 375/373, 375, 376
See application file for complete search history.

(56) References Cited

U.S. PATENT DOCUMENTS

| | | | |
|---|---|---|---|
| 7,965,108 B2 * | 6/2011 | Liu .................. | H03K 23/667 327/12 |
| 8,044,727 B2 * | 10/2011 | Higashi ............ | H03K 3/0315 331/117 R |
| 2012/0201289 A1 * | 8/2012 | Abdalla ........... | H04L 25/0272 375/233 |
| 2014/0070853 A1 * | 3/2014 | Sankaran ......... | H03K 21/026 327/115 |

* cited by examiner

*Primary Examiner* — Freshten N Aghdam
(74) *Attorney, Agent, or Firm* — Gregory J. Albin; Frank D. Cimino

(57) ABSTRACT

A current mode logic (CML) latch that includes a first transistor coupled to a second transistor, a third transistor coupled to a fourth transistor, a first capacitor connected to the first, second, third, and fourth transistors, and a second capacitor cross-coupled with the first capacitor and connected to the third and fourth transistors. The first and second transistors are configured to receive a data signal. The third and fourth transistors are configured to receive a clock signal.

20 Claims, 2 Drawing Sheets

HIGH SPEED CURRENT MODE LATCH

CROSS-REFERENCE TO RELATED APPLICATIONS

The present application claims priority to U.S. Provisional Patent Application No. 62/006,981, filed Jun. 3, 2014, titled "High Speed Current Mode (CML) Latch," which is hereby incorporated herein by reference in its entirety.

BACKGROUND

In many communication systems, data is streamed from one device to another without an accompanying clock signal. During the transmission, the signals carrying the data streams may become jittery and difficult to decipher and process by the receiving device. Therefore, many systems utilize clock and data recovery circuits (CDR) to retime the incoming signals carrying the data streams and transmit the retimed signals to the receiving device. This requires the CDR to generate a clock that locks to the frequency of the streamed data. In many systems, the CDR detects the frequency of the incoming signals and phase aligns the clock signal to the incoming signals. The incoming signal is then retimed with a clean clock that has been generated by the CDR. The retimed signal then may be output to the receiving device for further processing.

SUMMARY

The problems noted above are solved in large part by systems and methods for sampling data in a clock and data recovery circuit utilizing a current mode logic latch. In some embodiments, a current mode logic (CML) latch includes a first transistor coupled to a second transistor, a third transistor coupled to a fourth transistor, a first capacitor connected to the first, second, third, and fourth transistors, and a second capacitor cross-coupled with the first capacitor and connected to the third and fourth transistors. The first and second transistors are configured to receive a data signal. The third and fourth transistors are configured to receive a clock signal.

Another illustrative embodiment is a clock and data recovery circuit (CDR) comprising a phase-frequency detector (PFD) circuit and a voltage-controlled oscillator (VCO). The PFD circuit includes a CML latch that includes a first and a second transistor configured to receive a data signal and a first and a second capacitor cross-coupled to a third and fourth transistor. The third and fourth transistors are configured to receive a clock signal.

Yet another illustrative embodiment is a communication system comprising a transmitter, a CDR coupled to the transmitter, and a receiver coupled to the CDR. The CDR is configured to receive a data signal from the transmitter, generate a clock signal from the data signal, and generate an output signal. The receiver is configured to receive the output signal. The CDR includes a CML latch that includes a first transistor, a second transistor, a third transistor, a fourth transistor, a first capacitor, and a second capacitor. The first and second capacitors are cross-coupled to the third and fourth transistors.

BRIEF DESCRIPTION OF THE DRAWINGS

For a detailed description of various examples, reference will now be made to the accompanying drawings in which.

NOTATION AND NOMENCLATURE

Figure 1:
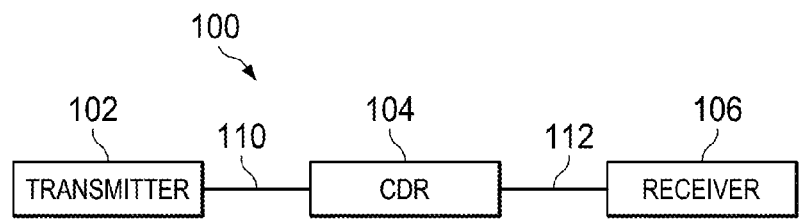
FIG. 1 shows a block diagram of a communication system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Communication systems may be utilized to transfer data from a transmitting device to a receiving device for further processing. One type of communication system is a fiber optic system. A fiber optic system transmits data through the transmission of pulses of light through an optical fiber. Due to the optics in the optical fiber and noise from semiconductor devices, the data signals may incur jitter (i.e., instantaneous deviation from the original periodicity of the data signal sent by the transmitter which may be observed in the signal amplitude, phase, or frequency of the signal). This jitter may decrease, or in some cases prevent entirely, the receiving device's capability to process the data signal. Clock and data recovery circuits (CDRs) may be utilized in these communication systems to retime the data signal, so that the receiving device may receive a correctly timed, jitter-free signal. Because the data signal is transmitted without an accompanying clock, the CDR detects the frequency and/or phase of the data signal in order to create a clock that is locked to the frequency and phase of the data signal. This allows for a retimed signal to be provided to the receiving device.

Typically, the phase detection and retiming aspects of the CDR require current mode logic (CML) latches. These latches are required to retime the incoming data signal and maintain the correct phase for the locally generated clock. It is important for the CML latches in the CDR to be as fast as possible which allows fast and accurate data sampling for retiming operations as well as affecting jitter tolerance. In the conventional CML latch, the location of components within the CML latch causes parasitic capacitance on the drain node of the clock transistors within the latch. This creates a delay in clock switching, thereby slowing the CML latch down. By cross-coupling capacitors to the clock transistors in the CML latch, the clock drain voltages may be pulled down faster. Thus, the parasitic capacitance in the CML latch may be nullified or offset, thereby speeding up the CML latch. In other words, because the clock may be a differential signal, a CML latch may take advantage of the differential clock to speed up switching in the CML latch by utilizing cross-coupled capacitors.

FIG. 1 shows a block diagram of a communication system 100 in accordance with various embodiments. Communication system 100 may include transmitter 102, clock and data recovery circuit (CDR) 104, and receiver 106. Communication system 100 may be any type of communication system, including a fiber optic communication system. Transmitter 102 is any device that may transmit signals, including signals carrying data. The signals transmitted by transmitter 102 may be generated by transmitter 102 or they may be received by transmitter 102 from another device and retransmitted to the receiver 106. In an embodiment, the signals transmitted by transmitter 102 are fiber optic signals and may include telephone signals, internet communication, and/or cable television signals. In alternative embodiments, the signals transmitted by transmitter 102 may include any other type of electrical or optical signal. In some embodiments, transmitter 102 may include a light-emitting diode (LED) or a laser diode.

CDR 104 is coupled to transmitter 102 through a communication link and is configured to receive the signal transmitted by transmitter 102, shown as data signal 110. The communication link may be a fiber optic or electrically conductive cable or any other type of communication link that allows communication of an electrical or optical signal from transmitter 102 to CDR 104. While data signal 110 may be any waveform, in some embodiments, it is a square wave and may be an optical signal. Additionally, data signal 110 may be a differential pair of signals. In other words, data signal 110 may include a pair of the same signal, except that the two signals are 180 degrees out of phase with each other. CDR 104 may be an electrical circuit configured to generate a clock signal from data signal 110. In some embodiments, data signal 110 does not contain an accompanying clock signal. Therefore, CDR 104 generates a clock signal from an approximate frequency reference and phase aligns to the transitions in data signal 110.

CDR 104 may generate an output signal 112 that has a phase and frequency related to the phase and frequency of the data signal 110. Thus, the data within data signal 110 may be transmitted within the output signal 112 of CDR 104. In other words, CDR 104 is configured to sample data signal 110 and regenerate it with the CDR 104 generated clean clock signal. Thus, CDR 104 retimes data signal 110 by replicating data signal 110 under a clean clock domain and outputs a signal 112 with a related phase and frequency that regenerates the same data. This may eliminate jitter that data signal 110 may have developed while being carried in the communication link.

Receiver 106 is coupled to CDR 104 through a communication link that carries output signal 112. Receiver 106 is configured to receive output signal 112 from CDR 104. The communication link may be a fiber optic or electrically conductive cable or any other type of communication link that allows communication of output signal 112 to receiver 106. While output signal 112 may be any waveform, in some embodiments, it is a square wave and may be an optical signal. Because output signal 112 may be an optical signal, in an embodiment, receiver 106 is configured to receive fiber optic signals and may include a photodetector. Receiver 106 then may process the data contained in the output signal 112 for further use. In some embodiments, the CDR 104 is separate from, but coupled to, the receiver 106. In other embodiments, the CDR 104 is a circuit that is included as part of the receiver 106.

Figure 2:
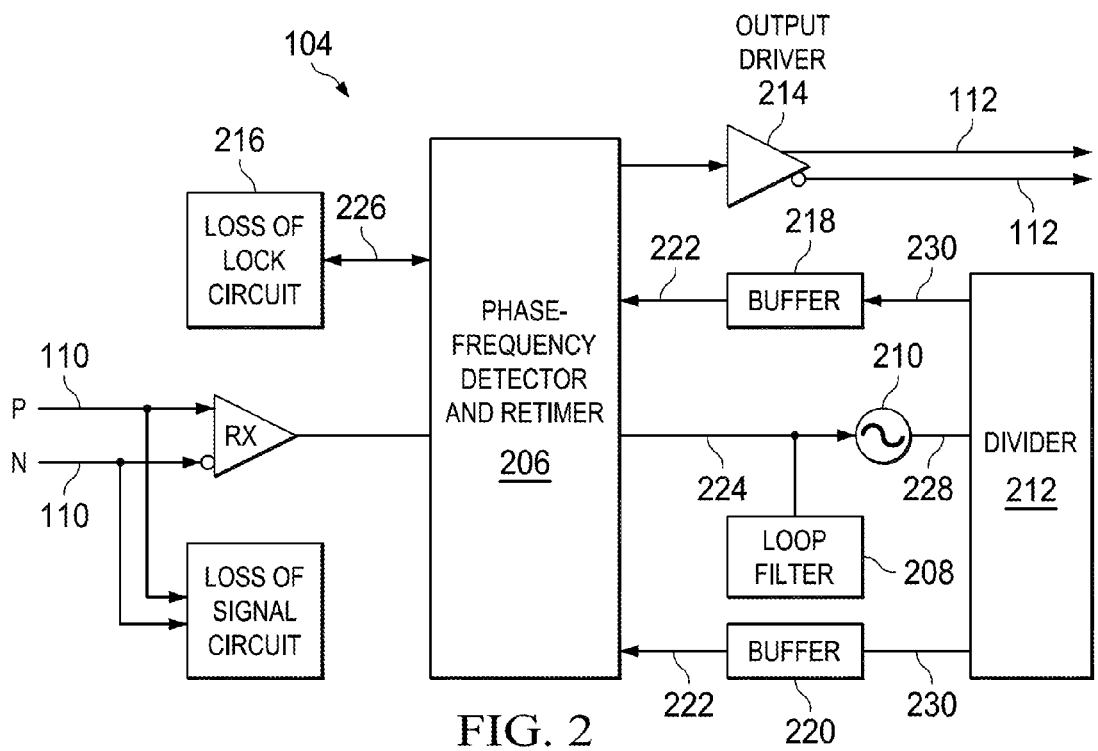
FIG. 2 shows a circuit diagram of a clock and data recovery circuit (CDR) in accordance with various embodiments.

FIG. 2 shows a circuit diagram of CDR 104 in accordance with various embodiments. CDR 104 may include a receiver 202, a loss of signal circuit (LOS) 204, a phase-frequency detector (PFD) 206, a loop filter 208, a voltage-controlled oscillator (VCO) 210, a divider 212, buffers 218 and 220, an output driver 214, and a loss of lock circuit (LOL) 216. Receiver 202 is configured to receive data signal 110. While receiver 202 is depicted as a p-n photodiode in FIG. 2 receiving data signal 110 as a differential signal, receiver 202 may be any type of receiver and in some embodiments, any photodetector including a p-i-n photodiode, an avalanche photodiode, or a metal-semiconductor-metal photodetector that is capable of receiving optical signals. LOS 204 is a circuit that is configured to determine whether data signal 110 is present for signal processing by CDR 104.

PFD 206 is configured to determine the frequency of the data signal 110 (i.e., the frequency of the data stream received by receiver 202). PFD 206 may also be configured to determine the phase in which to align the clock signal 222 of CDR 104. In other words, because the data signal 110 may be in the form of a square wave, the PFD 206 is configured to determine where to align the edges of the clock signal 222, which also may be in the form of a square wave, with respect to the edges of data signal 110. Additionally, PFD 206 may retime data signal 110 (i.e., PFD 206 may sample data signal 110 and regenerate it utilizing clock signal 222).

PFD 206 determines the difference in frequency and/or phase between data signal 110 and clock signal 222. If the signals are square waves, PFD 206 may determine this difference by comparing the rising edge of the data signal 110 square wave to the rising edge of the clock signal 222 square wave. PFD 206 then may produce error signals based on the amount of frequency and/or phase difference it has detected between data signal 110 and clock signal 222. The PFD 206 then may translate the error signals into proportional positive and negative charge packets in the form of combined charge pump output signal 224 which is then fed into loop filter 208. This may cause the voltage at the output of loop filter 208 to increase or decrease based on the amount of positive or negative charge that enters loop filter 208.

Loop filter 208 may be a low pass filter which may be used to convert combined charge pump output signal 224, which is in the form of a current, to voltage and also to create loop stability. Loop filter 208 may also be used to limit reference frequency energy (i.e., ripple) which may appear at the frequency detector 206 combined charge pump output signal 224. The filtered combined charge pump output signal 224 then may be provided to VCO 210 for tuning.

VCO 210 may be an electronic oscillator configured to control oscillation frequency by a voltage input. Thus, the frequency of oscillation created is varied by the applied voltage. Based on the voltages VCO 210 receives from loop filter 208, VCO 210 tunes, or changes, the frequency and/or phase of its output to better track, once it is divided, the data signal 110 and outputs a signal identified as VCO signal 228. Like data signal 110 and clock signal 222, VCO signal 228 may take any waveform, including a square wave and may be in the form of a differential signal.

Because, in some embodiments, VCO 210 produces VCO signal 228 at a higher frequency than data signal 110, divider 212 is used to divide down the VCO signal 228 and outputs divided VCO signal 230. In some embodiments, divider 212 divides VCO signal 228 by 2 to create two distinct loops carrying divided VCO signal 230 that are fed into PFD 206 after, in some embodiments, being buffered by buffers 218 and 220. In alternative embodiments, divider 212 divides VCO signal 228 by 4 to create 2 distinct loops carrying 2 different phases (i.e., a differential pair) of divided VCO signal 230 in each loop that are fed into PFD 206 after, in some embodiments, being buffered by buffers 219 and 220. Divider 212 may be a negative feedback D flip-flop. In other words, the negative output of divider 212 may act as an input for divider 212.

Because PFD 206 is physically separated from VCO 210, capacitance increases in the system. Therefore, in an embodiment, buffers 218 and 220 receive divided VCO signal 230 and may delay the transit of divided VCO signal 230 back to PFD 206. Once buffering is complete, buffers 218 and 220 may generate clock signal 222 to feed back into PFD 206.

LOL 216 is configured to determine whether the frequency of clock signal 222 is locked to the frequency of data signal 110 and/or if a locked clock signal 222 experiences a loss of lock with data signal 110. LOL 216 is coupled to PFD 206 and may send a lock signal 226 to PFD 206 that indicates that the clock signal 222 is locked to data signal 110 and/or that the clock signal 222 has lost lock or is not locked to data signal 110.

PFD 206 also provides a retimed, based on the locked clock signal 222, data signal 110 to output driver 214. Output driver 214 is any type of output driver that may transmit the retimed signal to receiver 106 for further processing as output signal 112. In some embodiments, output driver 214 is an optical output driver such as a electroabsorptive modulated laser (EML).

Figure 3:
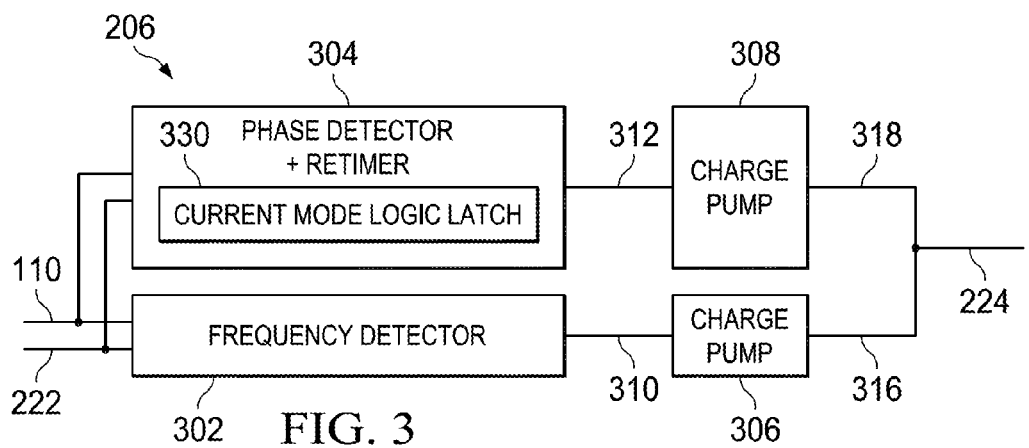
FIG. 3 shows a circuit diagram of a phase-frequency detector (PFD) circuit in accordance with various embodiments.

FIG. 3 shows a circuit diagram of PFD 206 in accordance with various embodiments. PFD 206 may include frequency detector 302 connected to charge pump 306 and phase detector and retimer (PDR) 304 connected to charge pump 308. Frequency detector 302 may be configured to acquire the frequency of data signal 110. Frequency detector 302 receives data signal 110 and clock signal 222 and may compare the rising edge of the data signal 110 square wave to the rising edge of the clock signal 222 square wave and generate error signal 310 based on the comparison. Error signal 310 may be designated as an UP or DOWN signal or pulse.

An UP signal created by frequency detector 302 may be an indication that the frequency of data signal 110 is higher than the frequency of clock signal 222. A DOWN signal created by frequency detector 302 may be an indication that the frequency of input signal 110 is lower than the frequency of clock signal 222. Charge pump 306 may receive error signal 310 from frequency detector 302 and translate the error signal 310 into proportional positive and negative charge packets which is output as a charge pump output signal 316. If charge pump 306 receives an UP signal, this may indicate that the data signal 110 frequency is higher than the clock signal 222 frequency, and a positive charge may be created to tune VCO 210 to produce a higher frequency VCO signal 228. If charge pump 306 receives a DOWN signal, this may indicate that the data signal 110 frequency is lower than the clock signal 222 frequency, and a negative charge may be created to tune VCO 210 to produce a lower frequency VCO signal 228.

PDR 304 also receives data signal 110 and clock signal 222 as input. PDR 304 may compare the rising edge of the input signal 110 square wave to the rising edge of the clock signal 222 square wave and generate error signal 312 based on the comparison. Error signal 312 may be designated as an UP or DOWN signal or pulse based on whether the clock signal 222 is earlier or later than data signal 110. Charge pump 308 receives error signal 312 from PDR 304 and translates the error signal 312 into proportional positive and negative charge packets which is output as a charge pump output signal 318. If charge pump 308 receives an UP signal, this may indicate that the data signal 110 frequency is higher than the clock signal 222 frequency, and a positive charge may be created to tune VCO 210 to produce a higher frequency VCO signal 228. If charge pump 308 receives a DOWN signal, this may indicate that the input signal 110 frequency is lower than the clock signal 222 frequency, and a negative charge may be created to tune VCO 210 to produce a lower frequency VCO signal 228. Charge pump output signals 316 and 318 are combined to create combined charge pump output signal 224 to be fed into loop filter 208 and VCO 210. PDR 304 also may retime data signal 110 based on the phase and frequency of clock signal 222. Thus, PDR 304 may sample data signal 110 and regenerate it based on clock signal 222.

PDR 304 may contain current mode logic (CML) latch 330. CML latch 330 may be necessary in order to effectuate the phase detection and retiming aspects of PDR 304. A faster CML latch 330 is desirable because it allows PDR 330 to sample data and make a determination of whether the data signal 110 and/or clock signal 222 is HIGH or LOW (i.e., a 1 or a 0) more quickly than a slower latch. This allows for timing margin to place clock signal 222 at an ideal position (i.e., phase shift) with respect to data signal 110. In other words, the faster CML latch 330 is, the faster CML latch 330 may make a determination of whether data signal 110 and/or clock signal 222 is HIGH or LOW which in turn provides better timing margins for CDR 104. Additionally, a faster retiming latch regenerates data signal 112 with less jitter than a slower latch.

Figure 4:
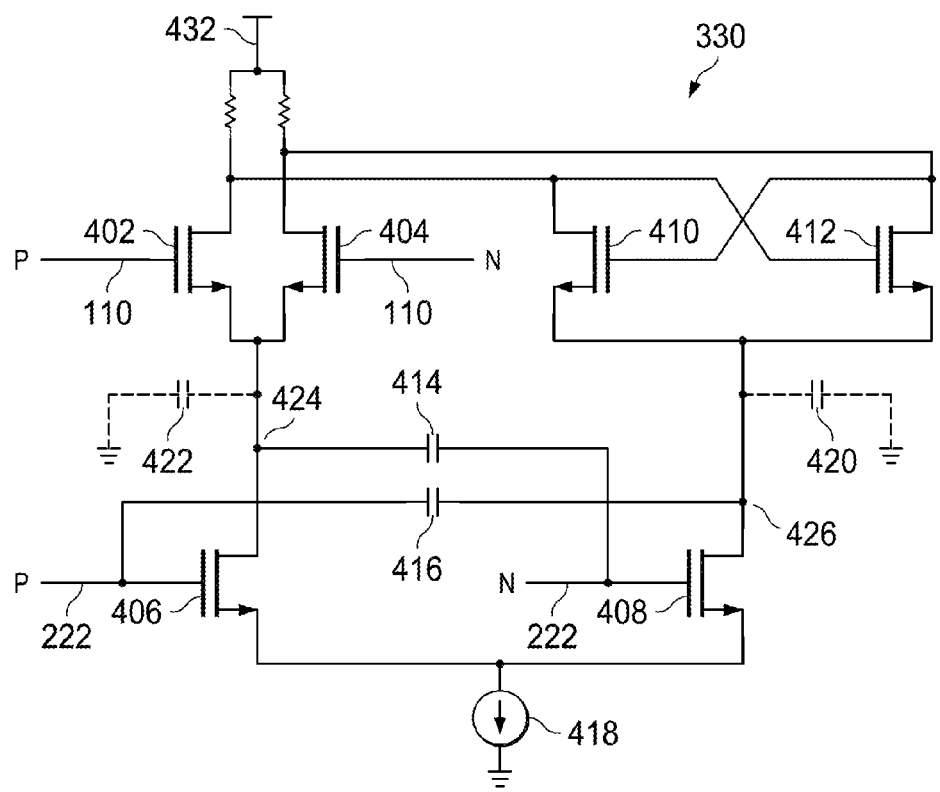
FIG. 4 shows a circuit diagram of a current mode logic latch in accordance with various embodiments.

FIG. 4 shows a circuit diagram of a CML latch 330 in accordance with various embodiments. CML latch 330 may include transistors 402, 404, 406, 408, 410, and 412, capacitors 414, 416, current source 418, and parasitic capacitors 420 and 422. Each of transistors 402-412 may be a field-effect transistor (FET) and more particularly may be an n-channel metal-oxide semiconductor field-effect (NMOS) transistor. In alternative embodiments, transistors 402-412 may be any other type of transistor including a p-channel metal-oxide-semiconductor field-effect (PMOS) transistor, a p-type junction gate field-effect transistor (PJFET), a n-type junction gate field-effect transistor (NJFET), and a bipolar junction transistor (BJT) (including PNP and NPN transistors). Transistors 410 and 412 act to give CML latch 330 swing.

Transistors 402 and 404 are configured to receive data signal 110. In some embodiments, data signal 110 is a differential signal; therefore, transistor 402 is configured to receive a portion of data signal 110 (i.e., one half of the differential pair, labelled the P signal) at the gate of transistor 402 while transistor signal 404 is configured to receive a second portion of data signal 110 (i.e., the other half of the differential pair, labelled the N signal) at the gate of transistor 404.

Transistors 406 and 408 are configured to receive clock signal 222. In some embodiments, clock signal 222 is a differential signal; therefore, transistor 406 is configured to receive a portion of clock signal 222 (i.e., one half of the differential pair, labelled the P signal) at the gate of transistor 406 while transistor signal 408 is configured to receive a second portion of clock signal 222 (i.e., the other half of the differential pair, labelled the N signal) at the gate of transistor 408.

If the portion of clock signal 222 received by transistor 406 is HIGH (i.e., 1), transistor 406, acting as a switch, is turned on. In this situation, the portion of clock signal 222 received by transistor 408 will be LOW (i.e., 0) and transistor 408 will be off. Thus, data signal 110, through transistors 402 and 404, drives the output 432 of CML latch 330. In some embodiments, this may be known as the sampling phase. However, when portion of clock signal 222 received by transistor 406 is LOW (i.e., 0), transistor 406 is turned off. Here, the portion of clock signal 222 received by transistor 408 will be HIGH (i.e., 1) and transistor 408 will be turned on. Thus, CML latch 330 will latch whatever was sampled during the sampling phase and keep the output 432 the same.

Due to the proximity of the components of CML latch 330, parasitic capacitors 420 and 422 may exist in CML latch 330. Parasitic capacitor 420 may exist at the drain of transistor 408 while parasitic capacitor 422 may exist at the drain of transistor 406. When the portion of clock signal 222 feeding transistor 406 transitions from LOW to HIGH, the node attached to parasitic capacitor 422 needs to reduce its voltage so that one of the branches controlled by transistors 402 and 404 may have its current pulled down. However, in a conventional CML latch without capacitors 414-416, the transitions that occur at the nodes connected to parasitic capacitors 420 and 422 slow down; therefore, the whole process of pulling down the current slows down. Thus, the conventional CML latch is slower.

Capacitor 414 is connected to the sources of transistors 402 and 404 and to the drain of transistor 406 through node 424. Additionally, capacitor 414 is connected to the gate of transistor 408. Capacitor 416 is connected to the gate of transistor 406 and the drain of transistor 408. Thus, capacitor 414 is connected between the gate of transistor 408 and the drain of transistor 406, while capacitor 416 is connected between the drain of transistor 408 and the gate of transistor 406. As such, capacitors 414 and 416 are cross-coupled to transistors 406 and 408. These cross-coupled capacitors 414 and 416 act to pull down current from nodes attached to the drains of transistors 406 and 408 making CML latch 330 faster and effectively discharging the parasitic capacitance caused by parasitic capacitors 420 and 422.

When the portion of clock signal 222 feeding transistor 406 transitions to HIGH, transistor 406 acts to pull down current from node 424. At the same time, the portion of clock signal 222 feeding transistor 408 transitions to LOW, and due to capacitor 414, current at node 424 is pulled down. Thus, in addition to transistor 404 pulling down current at node 424 through its drain, transistor 408 also pulls down current from node 424 through capacitor 414. This effectively discharges the parasitic capacitance caused by parasitic capacitor 422. Thus, CML latch 330 is faster than a conventional CML latch.

Similarly, when the portion of clock signal 222 feeding transistor 408 transitions to HIGH, transistor 408 acts to pull down current from node 426. At the same time, the portion of clock signal 222 feeding transistor 406 transitions to LOW, and due to capacitor 416, current at node 426 is pulled down. Thus, in addition to transistor 406 pulling down current at node 426 through its drain, transistor 406 also pulls down current from node 424 through capacitor 416. This effectively discharges the parasitic capacitance caused by parasitic capacitor 420. Thus, CML latch 330 is faster than a conventional CML latch.

In an embodiment, current source 418 is attached to the sources of transistors 406 and 408. In this embodiment, current source 418 regulates the amount of current that may flow through CML latch 330. In alternative embodiments, current source 418 is not present and the sources of transistors 406 and 408 are connected directly to ground. If the source of an NMOS transistor is not connected directly to ground (i.e., it is connected to a current source), the voltage at the body of the NMOS transistor and the voltage at the source of the NMOS transistor may be different. This may cause an increase in the threshold voltage of the NMOS transistor, slowing the transistor down. However, connecting the source of an NMOS transistor to directly to ground allows the body and source of the NMOS transistor to have the same voltage. Therefore, there is no body effect on the transistor, and the threshold voltage does not increase. Because transistors 406 and 408 may be NMOS transistors, connecting the source of transistors 406 and 408 directly to ground may increase the speed of those transistors. However, without current source 418, there is no limit on the current flowing through CML latch 330. Therefore, there is a need to control common mode voltage on transistors 406 and 408. Otherwise, swing may be affected. Thus, in this embodiment, a replica bias circuit that may control common mode signals for the clock signal 222 may be connected to CML latch 330. The replica bias circuit may be configured to maintain common mode voltage in CML latch 330 at a desired level.

Figure 5:
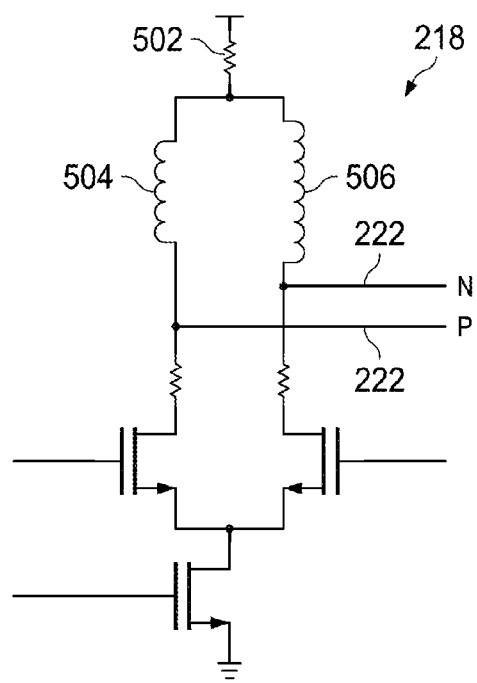
FIG. 5 shows a circuit diagram of a buffer in accordance with various embodiments.

FIG. 5 shows a circuit diagram of buffer 218 in accordance with various embodiments. Buffer 218 may be the same as or different than buffer 220. Buffer 218 may include a resistor 502, inductors 504 and 506. In some embodiments, resistor 502 is a variable resistor while in other embodiments resistor 502 is not variable. Resistor 502 may reduce common mode voltage going into CML latch 330 in clock signal 222 because the current flowing into CML latch 330 must flow through resistor 502. This current flow causes a common voltage drop to each portion of clock signal 222 that flows into transistors 406 and 408. Therefore, common mode voltage drops in the output signal 432 of CML latch 330.

Inductors 504 and 506 cause inductive peaking in the path of clock signal 222 (i.e., from VCO 210 and VCO signal 228 to divider 212 and divided VCO signal 230 to buffer 218 and clock signal 222). Because of the cross-coupled capacitors 414 and 416, capacitance is added to the load on clock signal 222. However, the inductors 504 and 506, through the inductive peaking, may nullify the added capacitance. This ensures that clock signal 222 can handle the increased load.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A current mode logic (CML) latch, comprising:
 a first transistor coupled to a second transistor, the first and second transistors configured to receive a data signal;
 a third transistor coupled to a fourth transistor, the third and fourth transistors configured to receive a clock signal,
 a first capacitor connected to the first, second, third, and fourth transistors; and
 a second capacitor connected to the third and fourth transistors, the first and second capacitors being cross-coupled with the third and fourth transistors such that parasitic capacitance in the CML latch is offset.

2. The CML latch of claim 1, wherein the data signal is a differential signal comprising first and second data signals out of phase with respect to each other, the first transistor being configured to receive the first data signal and the second transistor being configured to receive the second data signal.

3. The CML latch of claim 2, wherein the clock signal is a differential signal comprising a first and second clock signals out of phase with respect to each other, the third transistor being configured to receive the first clock signal and the fourth transistor being configured to receive the second clock signal.

4. The CML latch of claim 1, wherein the first capacitor is connected to a source of the first and second transistors, a drain of the third transistor, and a gate of the fourth transistor.

5. The CML latch of claim 4, wherein the second capacitor is connected to a gate of the third transistor and a drain of the fourth transistor.

6. The CML latch of claim 4, wherein the source of the first and second transistors is further connected to the drain of the third transistor.

7. The CML latch of claim 1, wherein the second capacitor is further connected to a source of a fifth transistor and a source of a sixth transistor.

8. The CML latch of claim 1, wherein a source of the third transistor and a source of the fourth transistor are connected directly to ground.

9. A clock and data recovery (CDR) circuit, comprising:
 a phase-frequency detector (PFD) circuit including a current mode logic (CML) latch that comprises a first and a second transistor configured to receive a data signal, and a first and a second capacitor cross-coupled to a third and a fourth transistor, the third and fourth transistors configured to receive a clock signal; and
 a voltage-controlled oscillator (VCO) coupled to the PFD, the VCO configured to generate a VCO output signal.

10. The CDR circuit of claim 9, further comprising:
 a divider configured to receive the VCO output signal and generate a divided VCO output signal; and
 a buffer configured to receive the divided VCO output signal and generate the clock signal.

11. The CDR circuit of claim 10, wherein the divider comprises a negative feedback D flip-flop.

12. The CDR circuit of claim 10, wherein the buffer includes a first and a second peaking inductor and a resistor connected to the first and second peaking inductors.

13. The CDR circuit of claim 12, wherein the buffer further includes a variable current source coupled to the first and second peaking inductors, and wherein the resistor is variable.

14. The CDR circuit of claim 9, wherein the PFD circuit further includes a replica bias circuit connected to the CML latch, the replica bias circuit configured to control a common mode voltage received by the CML latch.

15. The CDR circuit of claim 9, wherein:
 the data signal is a differential signal comprising a first data portion and a second data portion, the first transistor being configured to receive the first data portion and the second transistor being configured to receive the second data portion, and
 the clock signal is a differential signal comprising a first clock portion and a second clock portion, the third transistor being configured to receive the first clock portion and the fourth transistor being configured to receive the second clock portion.

16. The CDR circuit of claim 15, wherein the first capacitor is further connected to first, second, third, and fourth transistors.

17. The CDR circuit of claim 16, wherein based on the first clock portion being HIGH, the first capacitor draws down current in a node connected to the first, second, and third transistors.

18. A communication system, comprising:
 a transmitter;
 a clock and data recovery (CDR) circuit coupled to the transmitter, the CDR circuit configured to receive a data signal from the transmitter, generate a clock signal from the data signal, and generate an output signal; and
 a receiver coupled to the CDR circuit, the receiver configured to receive the output signal,
 wherein the CDR circuit includes a current mode logic (CML) latch that includes a first transistor, a second transistor, a third transistor, a fourth transistor, a first capacitor and a second capacitor, the first capacitor is connected to a gate of the third transistor and a drain of the fourth transistor and the second capacitor is connected to a gate of the fourth transistor and a drain of the third transistor.

19. The communication system of claim 18, wherein the CDR circuit further includes a divider configured to receive a VCO output signal from a voltage-controlled oscillator (VCO) and generate a divided VCO output signal, and a buffer configured to receive the divided VCO output signal and generate a clock signal, the third and fourth transistors configured to receive the clock signal.

20. The communication system of claim 19, wherein the buffer comprises a first and a second peaking inductor and a resistor connected to the first and second peaking inductors.

* * * * *